US009640685B2

(12) United States Patent
Sung

(10) Patent No.: US 9,640,685 B2
(45) Date of Patent: May 2, 2017

(54) SOLAR CELL AND METHOD OF FABRICATING THE SAME

(71) Applicant: LG INNOTEK CO., LTD., Seoul (KR)

(72) Inventor: Myoung Seok Sung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/352,385

(22) PCT Filed: Oct. 16, 2012

(86) PCT No.: PCT/KR2012/008444
§ 371 (c)(1),
(2) Date: Apr. 17, 2014

(87) PCT Pub. No.: WO2013/058521
PCT Pub. Date: Apr. 25, 2013

(65) Prior Publication Data
US 2014/0238486 A1 Aug. 28, 2014

(30) Foreign Application Priority Data
Oct. 17, 2011 (KR) ........................ 10-2011-0106121

(51) Int. Cl.
*H01L 31/0296* (2006.01)
*H01L 31/032* (2006.01)
(Continued)

(52) U.S. Cl.
CPC ...... *H01L 31/0296* (2013.01); *H01L 31/0322* (2013.01); *H01L 31/0749* (2013.01); *H01L 31/1828* (2013.01); *Y02E 10/541* (2013.01)

(58) Field of Classification Search
CPC .................. H01L 31/0296; H01L 31/1828
See application file for complete search history.

(56) References Cited

U.S. PATENT DOCUMENTS 5,261,968 A * 11/1993 Jordan .............. H01L 31/02246
136/244
5,501,744 A * 3/1996 Albright ........... H01L 31/02242
136/244
(Continued)

FOREIGN PATENT DOCUMENTS

KR 10-2010-0124741 A 11/2010
KR 10-2011-0036153 A 4/2011
(Continued)

OTHER PUBLICATIONS

Strehlow et al., "Compilation of Energy Band Gaps in Elemental and Binary Compound Semiconductors and Insulators", J. Phys. Chem. Ref. Data, vol. 2, No. 1, 1973, pp. 163-199.*
(Continued)

*Primary Examiner* — Golam Mowla
(74) *Attorney, Agent, or Firm* — Saliwanchik, Lloyd & Eisenschenk

(57) ABSTRACT

Disclosed are a solar cell and a method of fabricating the solar cell. The solar cell includes a back electrode layer; a light absorbing layer on the back electrode layer; and a buffer layer on the light absorbing layer, wherein the buffer layer includes a first buffer layer, a second buffer layer on the first buffer layer and a third buffer layer on the second buffer layer, and wherein the first buffer layer includes a group I-VI compound. A method of fabricating a solar cell includes the steps of: forming a back electrode layer on a substrate; forming a light absorbing layer on the back electrode layer; forming a second buffer layer on the light absorbing layer including selenium; and forming a third buffer layer including sulfide on the second buffer layer.

8 Claims, 3 Drawing Sheets

(51) Int. Cl.
  *H01L 31/0749* (2012.01)
  *H01L 31/18* (2006.01)

(56) References Cited

U.S. PATENT DOCUMENTS

| | | | | |
|---|---|---|---|---|
| 6,040,521 | A * | 3/2000 | Kushiya | H01L 31/02246 136/252 |
| 2008/0023059 | A1 * | 1/2008 | Basol | H01L 31/02246 136/244 |
| 2009/0020149 | A1 * | 1/2009 | Woods | H01L 21/385 136/244 |
| 2009/0139573 | A1 * | 6/2009 | Ramasesha | H01L 21/02568 136/262 |
| 2009/0223556 | A1 * | 9/2009 | Niesen | H01L 31/0322 136/255 |
| 2009/0301558 | A1 * | 12/2009 | Takaoka | H01L 27/14643 136/256 |
| 2010/0218827 | A1 | 9/2010 | Aono et al. | |
| 2011/0011451 | A1 | 1/2011 | Hakuma et al. | |
| 2011/0232749 | A1 * | 9/2011 | Lienhart | G02B 1/115 136/256 |
| 2012/0222742 | A1 | 9/2012 | Nakagawa et al. | |
| 2013/0065355 | A1 * | 3/2013 | Liang et al. | 438/95 |

FOREIGN PATENT DOCUMENTS

| | | |
|---|---|---|
| KR | 10-2011-0048262 A | 5/2011 |
| WO | WO-2011108685 A1 | 9/2011 |

OTHER PUBLICATIONS

International Search Report in International Application No. PCT/KR2012/008444, filed Oct. 16, 2012.
Office Action dated Sep. 25, 2015 in Chinese Application No. 2012800062499.8.

\* cited by examiner

SOLAR CELL AND METHOD OF FABRICATING THE SAME

CROSS-REFERENCE TO RELATED APPLICATIONS

This application is the U.S. national stage application of International Patent Application No. PCT/KR2012/008444, filed Oct. 16, 2012, which claims priority to Korean Application No. 10-2011-0106121, filed Oct. 17, 2011, the disclosures of each of which are incorporated herein by reference in their entirety.

TECHNICAL FIELD

The embodiment relates to a solar cell and a method of fabricating the same.

BACKGROUND ART

A method of fabricating a solar cell for solar photovoltaic power generation is as follows. First, after preparing a substrate, a back electrode layer is formed on the substrate and patterned by using a laser device, thereby forming a plurality of back electrodes.

Thereafter, a light absorbing layer, a buffer layer, and a high resistance buffer layer are sequentially formed on the back electrodes. Various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer. The energy band gap of the light absorbing layer is in the range of about 1 eV to about 1.8 eV.

Then, a buffer layer including cadmium sulfide (CdS) is formed on the light absorbing layer through a sputtering process. The energy bandgap of the buffer layer may be in the range of about 2.2 eV to about 2.4 eV. Thereafter, the high resistance buffer layer including zinc oxide (ZnO) is formed on the buffer layer through the sputtering process. The energy bandgap of the high resistance buffer layer is in the range of about 3.1 eV to about 3.3 eV.

Thereafter, a groove pattern may be formed in the light absorbing layer, the buffer layer, and the high resistance buffer layer.

Then, a transparent conductive material is laminated on the high resistance buffer layer, and is filled in the groove pattern. Therefore, a transparent electrode layer is formed on the high resistance buffer layer, and connection wires are formed in the groove pattern. A material constituting the transparent electrode layer and the connection wireless may include aluminum doped zinc oxide (AZO). The energy bandgap of the transparent electrode layer may be in the range of about 3.1 eV to about 3.3 eV.

Then, the groove pattern is formed in the transparent electrode layer, so that a plurality of solar cells may be formed. The transparent electrodes and the high resistance buffers correspond to each cell. The transparent electrodes and the high resistance buffers may be provided in the form of a stripe or a matrix.

The transparent electrodes and the back electrodes are misaligned with each other, so that the transparent electrodes are electrically connected to the back electrodes through the connection wires, respectively. Accordingly, the solar cells may be electrically connected to each other in series.

As described above, in order to convert the solar light into electrical energy, various solar cell apparatuses have been fabricated and used. One of the solar cell apparatuses is disclosed in Korean Unexamined Patent Publication No. 10-2008-0088744.

Meanwhile, it is crucial in such a solar cell how to reduce an energy bandgap difference between the buffer layer and the light absorbing layer to easily produce photovoltaic power. Therefore, studies for allowing the buffer layer and the light absorbing layer to have similar energy bandgaps have been actively performed.

DISCLOSURE OF INVENTION

Technical Problem

The embodiment provides a solar cell having improved photoelectric conversion efficiency.

Solution to Problem

According to the embodiment, there is provided a solar cell including a back electrode layer; a light absorbing layer on the back electrode layer; and a buffer layer on the light absorbing layer, wherein the buffer layer includes a first buffer layer, a second buffer layer on the first buffer layer and a third buffer layer on the second buffer layer, and wherein the first buffer layer includes a group I-VI compound.

According to one embodiment, there is provided a method of fabricating a solar cell including the steps of: forming a back electrode layer on a substrate; forming a light absorbing layer on the back electrode layer; forming a second buffer layer on the light absorbing layer including selenium; and forming a third buffer layer including sulfide on the second buffer layer.

Advantageous Effects of Invention

Since the buffer layer included in the solar cell according to the embodiment is divided into the second buffer layer and the third buffer layer, the buffer layer may have sequential energy bandgaps.

That is, a difference between energy bandgaps of the light absorbing layer and the buffer layer is reduced, such that photovoltaic power can be easily produced.

Thus, electrons can be easily transferred through the buffer layer, so that the solar cell according to the embodiment may have improved efficiency.

That is, as compared with a solar cell according to the related art having a buffer layer including only cadmium sulfide (CdS), the solar cell according the embodiment may have improved efficiency.

The buffer layer, which is included in solar cell according to another embodiment, includes the first buffer layer, the second buffer layer and the third buffer layer. The first buffer layer is interposed between the light absorbing layer and the second buffer layer, so that the coupling structure with respect to the light absorbing layer and the second buffer layer can be enhanced.

Since the first buffer layer is interposed, a copper (Cu) vacancy of the light absorbing layer can be doped with natrium. A great amount of natrium is distributed in a surface of the light absorbing layer which is placed near the first buffer layer, so that the light absorbing layer and the buffer layer may have similar energy bandgaps. Thus, an electron yield can be improved.

The method according to the embodiment can fabricate the solar cell having the above-described effects.

MODE FOR THE INVENTION

Figure 1:
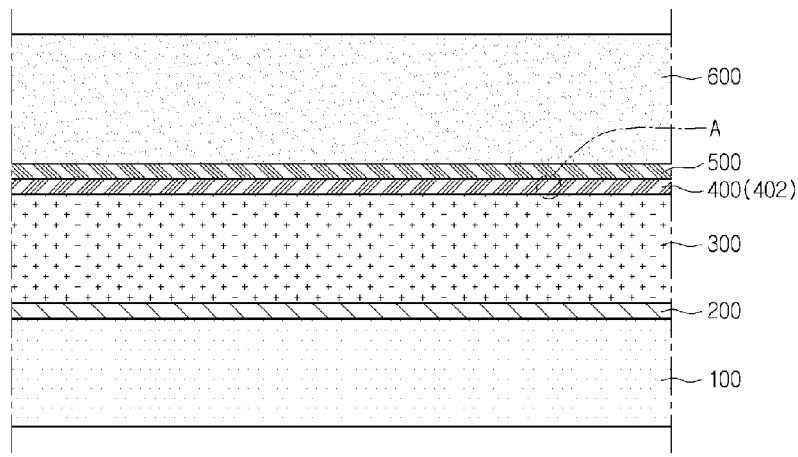
FIG. 1 is a sectional view showing a solar cell according to the first embodiment.

In the description of the embodiments, it will be understood that when a layer, a film, a region, a pattern or a structure is referred to as being "on" or "under" another substrate, another layer, a film, or another pattern, it can be "directly" or "indirectly" on the other layer, the other film, the other pattern, or one or more intervening layers may also be present. The positions of each layer have been described with reference to the drawings.

The size or thickness of the elements shown in the drawings may be exaggerated for the purpose of obvious and convenient explanation and may not utterly reflect the actual size.

Hereinafter, embodiments will be described in detail with reference to the accompanying drawings.

Figure 2:
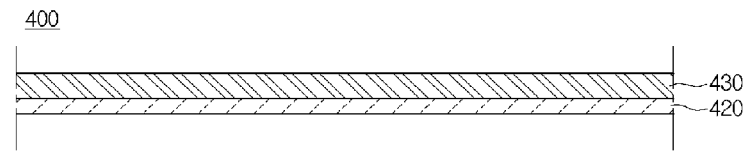
FIG. 2 is an enlarged view of "A" in FIG. 1.

First, a solar cell according to the first embodiment will be described with reference to FIGS. 1 and 2. FIG. 1 is a sectional view showing the solar cell according to the first embodiment. FIG. 2 is an enlarged view of "A" in FIG. 1.

Referring to FIG. 1, the solar cell includes a support substrate 100, a back electrode layer 200, a light absorbing layer 300, a buffer layer 400, a high resistance buffer layer 500, and a front electrode layer 600.

The support substrate 100 has a plate shape and supports the back electrode layer 200, the light absorbing layer 300, the buffer layer 400, the high resistance buffer layer 500, and the front electrode layer 600.

The support substrate 100 may include an insulator. The support substrate 100 may include a glass substrate, a plastic substrate, or a metallic substrate. In more detail, the support substrate 100 may include a soda lime glass substrate. The support substrate 100 may be transparent. The support substrate 100 may be rigid or flexible.

The back electrode layer 200 is provided on a top surface of the support substrate 100. The back electrode layer 200 may be a conductive layer. The back electrode layer 200 may include a metal, such as molybdenum.

In addition, the back electrode layer 200 may include at least two layers. In this case, the layers may be formed by using the homogeneous metal or heterogeneous metals.

The light absorbing layer 300 is provided on the back electrode layer 200. The light absorbing layer 300 includes a group I-III-VI compound. For example, the light absorbing layer 300 may have a $Cu(In,Ga)Se_2$ (CIGS) crystal structure, a $Cu(In)Se_2$ crystal structure, or a $Cu(Ga)Se_2$ crystal structure.

The light absorbing layer 300 may have an energy bandgap in the range of about 1 eV to about 1.8 eV.

The buffer layer 400 is provided on the light absorbing layer 300. The buffer layer 400 makes direct contact with the absorbing layer 300.

The buffer layer 400 may include two layers or more. In detail, referring to FIG. 2, the buffer layer 400 may include a second buffer layer 420 and a third buffer layer 430.

The second buffer layer 420 is placed on the light absorbing layer 300.

The second buffer layer 420 includes selenium (Se). In detail, the second buffer layer 420 includes CdSe.

The second buffer layer 420 may have a thickness of the range of 10 nm to 20 nm.

An energy bandgap of the second buffer layer 420 may be about 1.7 eV.

The third buffer layer 430 is placed on the second buffer layer 420.

The third buffer layer 430 include sulfide. In detail, the third buffer layer 430 includes cadmium sulfide (CdS).

The third buffer layer 430 has a thickness in the range of 30 nm to 40 nm.

An energy bandgap of the third buffer layer 430 may be about 2.4 eV.

The energy bandgap of the buffer layer 400 is increased in a stapped form that is, sequentially. That is, since the buffer layer 400 is divided into the second buffer layer 420 and the third buffer layer 430, the buffer layer 400 has a sequential energy bandgap.

That is, by reducing an energy bandgap difference between the light absorbing layer 300 and the buffer layer 400, photovoltaic power is easily produced.

Therefore, electrons may be easily transferred through the buffer layer 400, so that the solar cell according to the embodiment has improved efficiency.

As compared with a solar cell having the buffer layer 400 consisting of only CdS, the solar cell according to the embodiment has improved efficiency.

The high resistance buffer layer 500 is disposed on the buffer layer 400. The high resistance buffer layer 500 includes i-ZnO which is zinc oxide not doped with impurities. The high resistance buffer layer 500 may have an energy bandgap in the range of about 3.1 eV to about 3.3 eV.

The front electrode layer 600 is provided on the light absorbing layer 300. In more detail, the front electrode layer 600 is provided on the high resistance buffer layer 500.

The front electrode layer 600 is provided on the high resistance buffer layer 500. The front electrode layer 600 is transparent. For example, the front electrode layer 600 may include an Al doped zinc oxide (AZO), an indium zinc oxide (IZO), or an indium tin oxide (ITO).

The front electrode layer 600 may have a thickness in the range of about 500 nm to about 1.5 μm. Further, when the front electrode layer 600 is formed of Al doped zinc oxide, the front electrode layer 600 may be doped at a rate in the range of about 2.5 wt % to about 3.5 wt %. The front electrode layer 600 is a conductive layer.

Hereinafter, a solar cell according to the second embodiment will be described with reference to FIGS. 3 and 4. In the following description, for the purpose of clear and simple explanation, the details of structures and components the same as or similar to those in the first embodiment will be omitted.

Figure 3:
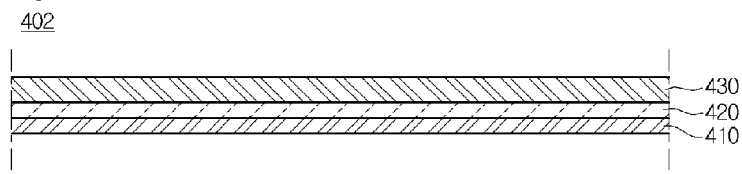
FIG. 3 is a sectional view showing a buffer layer included in a solar cell according to the second embodiment.
Figure 4:
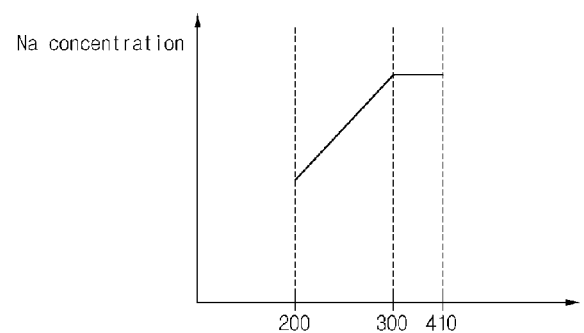
FIG. 4 is a graph illustrating a concentration of natrium included in each layer of the solar cell according to the second embodiment.

FIG. 3 is a sectional view of a buffer layer 400 included in a solar cell according to the second embodiment. FIG. 4 is a graph illustrating a concentration of natrium included in each layer of the solar cell according to the second embodiment.

Referring to FIG. 3, the buffer layer 400 included in the solar cell according to the second embodiment includes a first buffer layer 410, a second buffer layer 420 and a third buffer layer 430.

The first buffer layer 410 is placed on the light absorbing layer 300.

The first buffer layer 410 includes group I and VI compounds. The first buffer layer 410 may include natrium. In detail, the first buffer layer 410 may include Na2Se.

The first buffer layer 410 may have a thickness of 10 nm or below.

The second buffer layer 420 is placed on the first buffer layer 410.

Since the second and third buffer layers 420 and 430 are the same as or similar with the second and third buffers layers 420 and 430 according to the first embodiment, the detailed description will be omitted.

Since the first buffer layer 410 is interposed between the light absorbing layer 300 and the second buffer layer 420, the coupling structure with respect to the light absorbing layer 300 and the second buffer layer 420 can be enhanced.

Due to the interposition of the first buffer layer 410, natrium is doped into the Cu vacancy of the light absorbing layer 300. Referring to FIG. 4, the concentration of natrium in the light absorbing layer 300 is gradually increased toward the first buffer layer 410. That is, the natrium is distributed much more at the the surface placed near the first buffer layer 410, so that the light absorbing layer 300 and the buffer layer 400 may have energy bandgaps similar to each other. Thus, the electron yield may be improved.

Figure 5:
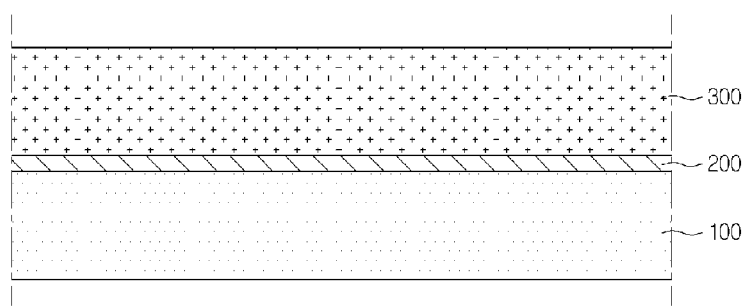
FIGS. 5 to 7 are sectional views illustrating a process of fabricating the solar cell according to the first embodiment.
Figure 6:
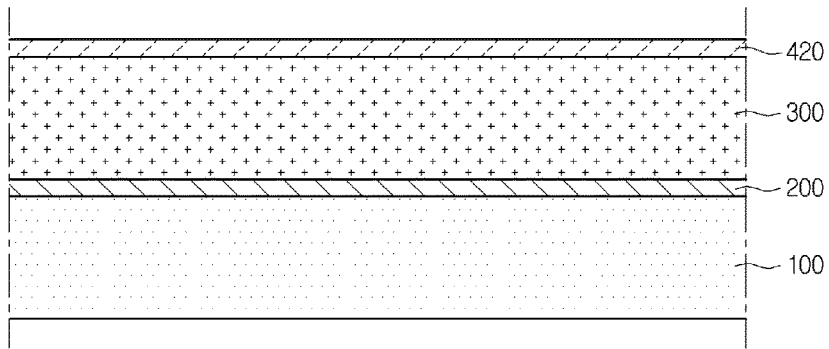
Figure 7:
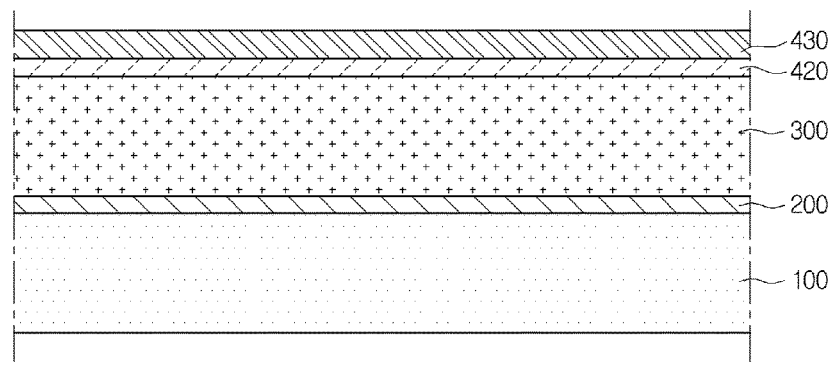

Hereinafter, a method of fabricating the solar cell according to the first embodiment will be described with reference to FIGS. 5 to 7. FIGS. 5 to 7 are sectional views illustrating a process of fabricating the solar cell according to the first embodiment.

The method of fabricating the solar cell according to the first embodiment includes a step of forming a back electrode layer 200 on a support substrate 100, a step of forming a light absorbing layer 300, a step of forming a second buffer layer 420, and a step of forming a third buffer layer 430.

Referring to FIG. 5, a metal such as molybdenum is deposited on the support substrate 100 through a sputtering process to form the back electrode layer 200. The back electrode layer 200 may be formed by twice performing a process in different conditions.

An additional layer such as a diffusion barrier layer may be interposed between the support substrate 100 and the back electrode layer 200.

Next, the light absorbing layer 300 is formed on the back electrode layer 200. The light absorbing layer 300 may be formed through a sputtering process or an evaporation process.

For example, various schemes, such as a scheme of forming a Cu(In,Ga)Se2 (CIGS) based-light absorbing layer 300 by simultaneously or separately evaporating Cu, In, Ga, and Se and a scheme of performing a selenization process after a metallic precursor film has been formed, have been extensively used in order to form the light absorbing layer 300.

Regarding the details of the selenization process after the formation of the metallic precursor layer, the metallic precursor layer is formed on the back electrode layer 200 through a sputtering process employing a Cu target, an In target, or a Ga target.

Thereafter, the metallic precursor layer is subject to the selenization process so that the Cu(In,Ga)Se2 (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or Cu and Ga targets and the selenization process.

Then, referring to FIG. 6, the second buffer layer 420 is formed on the light absorbing layer 300.

The second buffer layer 420 may be formed through a CBD (Chemical Bath Deposition) process, a chemical vapor deposition (CVD) process, a spray scheme or a physical vapor deposition (PVD) process.

As one example, the second buffer layer 420 may be formed through a chemical vapor deposition (CVD) process using a Cd(EtBu-dsc)2 precursor.

Referring to FIG. 7, the third buffer layer 430 is formed on the second buffer layer 420.

The third buffer layer 430 may be formed through a CBD process, a CVD process, a spray scheme or a PVD process.

As one example, the third buffer layer 430 may be formed through a CBD (Chemical Bath Deposition) process. For example, after the second buffer layer 420 has been formed, the second buffer layer 420 is immersed into a solution including materials used to form cadmium sulfide (CdS), and the third buffer layer 430 including CdS is formed on the second buffer layer 420.

Thereafter, zinc oxide is deposited on the third buffer layer 430 through a sputtering process, thereby forming a high resistance buffer layer.

A front electrode layer is formed on the high resistance buffer layer. A transparent conductive material is stacked on the high resistance buffer layer to form the front electrode layer. For example, the transparent conductive material includes aluminum (Al) doped zinc oxide.

Hereinafter, a method of fabricating a solar cell according to the second embodiment will be described with reference to FIGS. 8 to 10.

Figure 8:
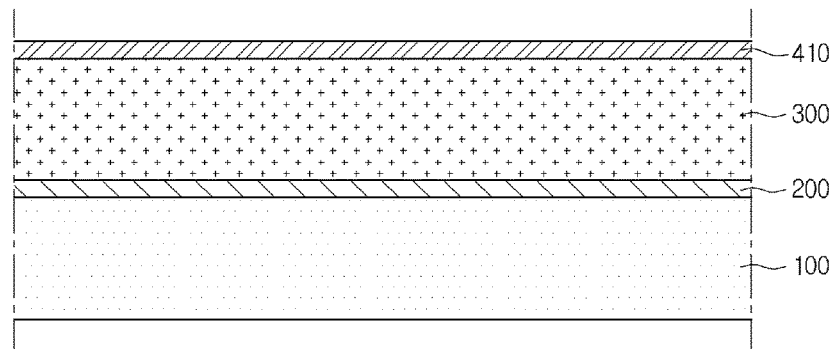
FIGS. 8 to 10 are sectional views illustrating a process of fabricating the solar cell according to the second embodiment.
Figure 9:
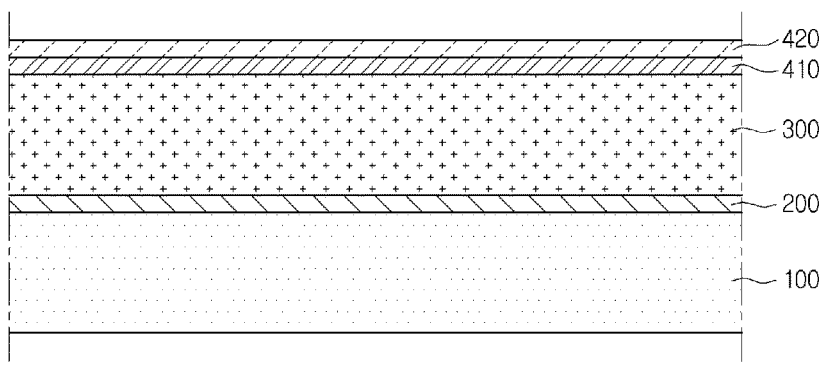
Figure 10:
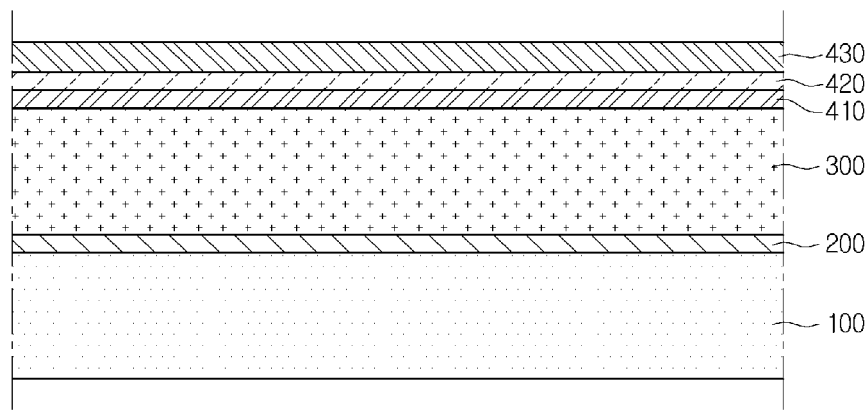

FIGS. 8 to 10 are sectional views illustrating a process for fabricating the solar cell according to the second embodiment.

Referring to FIG. 8, the first buffer layer 410 is formed on the light absorbing layer 300.

The first buffer layer 410 may be formed through a CBD process, a CVD process, a spray scheme or a PVD process.

Thereafter, referring to FIGS. 9 and 10, the second and third buffer layers 420 and 430 may be formed on the first buffer layer 410.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a back electrode layer;
   a light absorbing layer on the back electrode layer; and
   a buffer layer on the light absorbing layer;
   wherein the buffer layer includes a first buffer layer, a second buffer layer on the first buffer layer, and a third buffer layer on the second buffer layer;
   wherein energy bandgaps sequentially decrease from the third buffer layer to the second buffer layer,
   wherein energy bandgap of the second buffer layer is about 1.7 eV;
   wherein energy bandgap of the third buffer layer is about 2.4 eV;
   wherein a thickness of the first buffer layer is smaller than a thickness of the second buffer layer, and the thickness of the second buffer layer is smaller than a thickness of the third buffer layer;
   wherein the thickness of the first buffer layer is less than 10 nm,
   wherein the thickness of the second buffer layer is in a range of 10 nm to 20 nm,
   wherein the thickness of the third buffer layer is in a range of 30 nm to 40 nm,
   wherein the first buffer layer includes a group I-VI compound.

2. The solar cell of claim 1, wherein the first buffer layer includes natrium.

3. The solar cell of claim 1, wherein the first buffer layer includes sodium selenide (Na2Se).

4. The solar cell of claim 1, wherein the second buffer layer includes selenium.

5. The solar cell of claim 1, wherein the second buffer layer includes cadmium selenide (CdSe).

6. The solar cell of claim 1, wherein the third buffer layer includes sulfide.

7. The solar cell of claim 1, wherein the third buffer layer includes cadmium sulfide (CdS).

8. The solar cell of claim 1, wherein the light absorbing layer has a natrium concentration which is gradually increased toward the first buffer layer.

* * * * *